United States Patent [19]
Gardner et al.

[11] Patent Number: 6,054,385
[45] Date of Patent: Apr. 25, 2000

[54] ELEVATED LOCAL INTERCONNECT AND CONTACT STRUCTURE

[75] Inventors: Mark I. Gardner, Cedar Creek; Fred Hause, Austin, both of Tex.

[73] Assignee: Advanced Micro Devices, Inc., Sunnyvale, Calif.

[21] Appl. No.: 08/792,086

[22] Filed: Jan. 31, 1997

[51] Int. Cl.$^7$ .................................................. H01L 21/283
[52] U.S. Cl. ...................... 438/655; 438/618; 438/630; 438/651
[58] Field of Search ..................................... 438/655, 637, 438/651, 657, 594, 585, 596, 598, 128, 618, 630; 257/776

[56] References Cited

U.S. PATENT DOCUMENTS

| | | | |
|---|---|---|---|
| 4,654,214 | 3/1987 | Ho | 156/628 |
| 5,322,809 | 6/1994 | Moslehi | 437/41 |
| 5,723,362 | 3/1998 | Inoue et al. | 437/190 |
| 5,801,088 | 9/1998 | Gardner et al. | 438/585 |
| 5,861,676 | 11/1996 | Yen | 257/776 |

OTHER PUBLICATIONS

Wolf, S., Silicon Processing for the VLSI Era, vol. 2: Process Integration. Lattice Press, pp. 385–387, 432, 1990.

Jaeger, Richard C. Introduction to Microelectronic Fabrication. vol. 5 Addison Wesley Publishing Company. pp. 133, 142, May 1993.

*Primary Examiner*—Olik Chaudhuri
*Assistant Examiner*—Ginette Peralta
*Attorney, Agent, or Firm*—Kevin L. Daffer; Conley, Rose & Tayon

[57] ABSTRACT

A semiconductor process in which a local interconnect, formed above a first transistor level, is connected to the first transistor level through a self-aligned and low resistivity contact structure. A semiconductor substrate is provided and a first transistor level formed on an upper surface of the semiconductor substrate. The first transistor level includes a first transistor. A local interconnect is then formed over the first transistor level. The local interconnect is vertically displaced above the first transistor level such that the local interconnect may traverse a gate of the first transistor without contacting the gate. A contact structure is then formed to connect the first source/drain structure of the first transistor with the local interconnect. The contact structure includes a first self-aligned silicide at an interface between the contact structure and the first source/drain region and further includes a second self-aligned silicide at an interface between the contact structure and the local interconnect.

10 Claims, 2 Drawing Sheets

ELEVATED LOCAL INTERCONNECT AND CONTACT STRUCTURE

BACKGROUND OF THE INVENTION

1. Field of the Invention

The present invention relates to the field of semiconductor processing, and more particularly to a method for utilizing a local interconnect and connecting the local interconnect to an underlying transistor level.

2. Description of the Relevant Art

Integrated circuits are widely employed in a variety of electronics applications to produce complex electronics circuits on an extremely small area of a monolithic semiconductor substrate, such as silicon. Universally recognized for their low cost, high speed, low power dissipation, and high reliability, semiconductor integrated circuits long ago replaced discreet components as the preferred electronic devices for most electronics applications. World-wide sales of integrated circuits have increased exponentially since the early 1960s. During this time, semiconductor manufacturers have striven to reduce the cost and increase the complexity of integrated circuits by fabricating a larger number of transistors in a given area of the semiconductor substrate. The primary means of achieving these goals has been reducing the size of the individual transistors that comprise the integrated circuit. Smaller transistors enable the fabrication of more complex and smaller devices. Smaller devices increase the number of devices manufacturable on a single semiconductor wafer and increase the probability that any individual device on a given silicon wafer will be free of random fatal defects. Since the early 1960's, when the average design rule within the industry was approximately 25 microns, the average design rule has decreased rather steadily by approximately 11% per year. The average design rule dropped below one micron in the mid 1980s, and has been decreasing steadily since then.

Transistor geometries on many semiconductor processes are now in the deep submicron region. Additional miniturization of transistor geometries is becoming increasingly difficult and costly to achieve. In response, semiconductor manufacturers are constantly seeking alternative methods of increasing transistor density to enable the cost effective production of ever increasingly complex integrated circuits. One such method involves the fabrication of a multi-layer transistor structure. In this method, a second transistor level is fabricated on a first transistor level to minimize the percentage of the silicon substrate devoted to transistor isolation. Multi-layer transistor structures are disclosed and claimed in a pending U.S. patent application entitled "Transistor Formation for Multi-Level Transistors" by Mark Gardner and filed on Sep. 30, 1996, [hereinafter referred to "the prior application"]. This application is incorporated by reference herein. Although the prior application discloses a method of increasing transistor density, it did not suggest a method of connecting features of the upper transistor level with features of the lower transistor level. A person of ordinary skill would typically form interconnects from the upper transistor level to the lower transistor level in a conventional fashion by forming a contact hole in an interlevel dielectric above the first transistor level and filling the hole with a conductive material such as aluminum or copper. This conventional method of interconnecting two levels of the integrated circuit requires the deposition of an additional interlevel dielectric and the formation of an independent interconnect level thereby adding increased complexity and cost to the semiconductor process. In addition, such a contact structure would be susceptible to junction spiking and other reliability issues. Accordingly, it would be beneficial to implement a more reliable semiconductor process in which a second interconnect level could be connected to an underlying first transistor level without unduly increasing the complexity or cost of the process.

SUMMARY OF THE INVENTION

The problems identified above are in large part addressed by a semiconductor process in which a local interconnect, formed above a first transistor level, is connected to the first transistor level through a self-aligned, low resistivity and highly reliable contact structure. Broadly speaking, the present invention contemplates a semiconductor process in which a semiconductor substrate is provided and a first transistor level formed on an upper surface of the semiconductor substrate. The first transistor level includes a first transistor. A local interconnect is then formed over the first transistor level. The local interconnect is vertically displaced above the first transistor level such that the local interconnect may traverse a gate of the first transistor without contacting the gate. A contact structure is then formed to connect the first source/drain structure of the first transistor with the local interconnect. The contact structure includes a first self-aligned silicide at an interface between the contact structure and the first source/drain region and further includes a second self-aligned silicide at an interface between the contact structure and the local interconnect.

The semiconductor substrate is preferably monocrystalline silicon and is still more preferably comprised of a p-type epitaxial layer formed on a p+ silicon bulk. A resistivity of the p-type epitaxial layer is preferably in the range of approximately 10 to 15 $\Omega$-cm. The formation of the first transistor level preferably includes the steps of forming a gate dielectric on an upper surface of the semiconductor substrate, depositing a first conductive gate layer on the gate dielectric, patterning the first conductive gate layer to produce a first conductive gate structure, and forming a first pair of source/drain structures in the semiconductor substrate. The first conductive gate structure is aligned over a first channel region of the semiconductor substrate and the first source/drain structures are laterally disposed on either side of the channel region. In a presently preferred embodiment, the first transistor level includes an interlevel dielectric which electrically isolates the first transistor level. In one embodiment, the formation of the first transistor level further includes the steps of depositing oxide on a topography cooperatively defined by the first transistor and an upper surface of the semiconductor substrate and planarizing the interlevel dielectric to produce a substantially planar interlevel dielectric upper surface. The preferred process of forming the local interconnect comprises the steps of etching a local interconnect trench in the interlevel dielectric, depositing a local interconnect material over the interlevel dielectric, and removing portions of the local interconnect material from regions exterior to the local interconnect trench. The local interconnect material is preferably comprised of polysilicon in a presently preferred embodiment. Removal of the portions of the local interconnect material from regions exterior to the local interconnect trench is preferably accomplished with a chemical mechanical polish.

The formation of the contact structure preferably includes the steps of etching a contact opening in the interlevel dielectric, forming a metal spacer structure on a sidewall of the contact opening, depositing tungsten in contact with the metal spacer structure, and annealing the contact structure. The metal spacer structure on the sidewall of the contact opening contacts the local interconnect and the first source/ drain structure. The annealing of the contact structure forms the silicide structures that are in contact with the local interconnect and with the first source/drain structure. The metal used for the metal spacer structure is preferably nickel, palladium, platinum, titanium, or cobalt.

The present invention further contemplates an integrated circuit The integrated circuit includes a first transistor level formed on an upper surface of the semiconductor substrate, a local interconnnect, and a contact structure. The first transistor level includes a first transistor. The local interconnect is vertically displaced above an upper surface of the semiconductor substrate. The contact structure provides an electrical connection between a first source/drain structure of the first transistor and the local interconnect. The first transistor level preferably further includes an interlevel dielectric. The first transistor preferably includes a gate dielectric formed on an upper surface of the semiconductor substrate, a conductive gate formed on the gate dielectric, and a pair of source/drain structures. The conductive gate is aligned over a channel region of the semiconductor substrate, and the pair of source/drain structures are laterally displaced on either side of the channel region.

Preferably, the gate dielectric of the integrated circuit is a thermal oxide and the conductive gate includes polysilicon. In one embodiment, the first source/drain structures include a source/drain impurity distribution substantially contented within a pair of source/drain regions that are laterally displaced on either side of the channel region. The local interconnect is preferably comprised of polysilicon. The preferred contact structure includes a metal outer shell, a first silicide, and a second silicide. The metal outer shell extends from the first source/drain structure to the local interconnect. The first silicide is formed at an interface between the metal outer shell and the first source/drain structure. The second silicide is formed at an interface between the outer shell and the local interconnect. Preferably, the metal outer shell is cobalt, nickel, titanium, platinum, palladium or an appropriate alloy. In one embodiment, the integrated circuit further includes a contact structure core. The core fills a channel tunnel defined by an inner sidewall of the metal outer shell. The core metal is preferably aluminum, copper, tungsten, or an alloy thereof.

BRIEF DESCRIPTION OF THE DRAWINGS

Other objects and advantages of the invention will become apparent upon reading the following detailed description and upon reference to the accompanying drawings in which.

Figure 1:
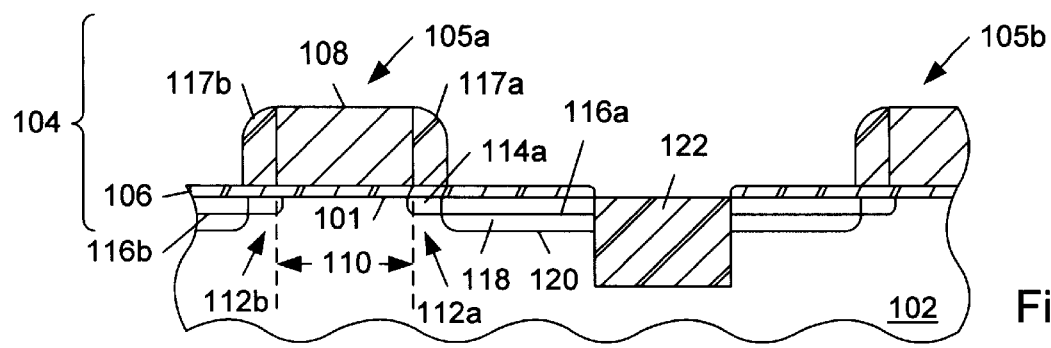
FIG. 1 is a partial cross-sectional view of a semiconductor substrate upon which a first transistor level has been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1 through 6 disclose a processing sequence for forming an elevated local interconnect to connect a local interconnect to a first transistor level in an integrated circuit. The process includes the steps of providing a semiconductor substrate 102, forming a first transistor level 104, forming a local interconnect 150, and forming a contact structure 170. First transistor level 104 is formed on an upper surface 101 of semiconductor substrate 102. First transistor level 104 includes a first transistor 105a. Local interconnect 150 is vertically displaced above first transistor 105 such that local interconnect 150 can traverse a gate 108 of first transistor 105a without contacting gate 108. Contact structure 170 connects a first source/drain structure 112a of first transistor 105a with local interconnect 150. Contact structure 170 includes a first self-aligned silicide 166a located at an interface between contact structure 170 and first source/drain region 166a. Contact structure 170 further includes a second self-aligned silicide 166b at an interface between contact structure 170 and local interconnect 150.

Turning now in more detail to FIG. 1, a first transistor level 104 is shown formed upon an upper surface 101 of semiconductor substrate 102. In the preferred embodiment, the formation of first transistor level 104 includes the steps of forming a gate dielectric 106, depositing a first conductive gate layer (not shown in FIG. 1), patterning the first conductive gate layer to produce a first conductive gate structure 108, and forming a first pair of source/drain structures 112a and 112b. First conductive gate structure 108 is aligned over a first channel region 110 of semiconductor substrate 102. The first pair of source/drain structures 112a and 112b are laterally disclosed on either side of channel region 110. Semiconductor substrate 102 is preferably formed of monocrystalline silicon substrate 102. Still more preferably, semiconductor substrate 102 includes a p-type epitaxial layer having a sheet resistivity in the range of approximately 10 to 15 Ωcm formed on a p+ silicon bulk (for purposes of this disclosure, an n+ or p+ designation refers to a doping concentration in excess of approximately $10^{19}$ atoms/cm$^3$). In the embodiment of first transistor 105a shown in FIG. 1, first and second source/drain structures 112a and 112b respectively include the well known lightly doped drain (LDD) impurity profile. With an LDD profile, source/drain structure 112a includes a lightly doped impurity distribution 114a substantially contained within a lightly doped region 116a, a heavily doped source/drain impurity distribution 118 substantially contained within in a heavily doped region 120. A peak concentration of lightly doped impurity distribution 114a is preferably less than a peak concentration of heavily doped impurity distribution 118. The lightly doped source/drain structures 112a and 112b shown in FIG. 1 are effective in reducing the maximum electric field generated within the semiconductor substrate reducing hot electron and thereby improving the expected lifetime and overall quality of the subsequently formed semiconductor transistor.

In conjunction with the formation of LDD source/drain structures, first transistor 105a further includes spacer structures 117a and 117b formed on sidewalls of the conductive gate 108 after the formation of the lightly doped regions 116a and 116b. Spacer structures 117a and 117b provide an effective blocking structure for the subsequent implantation of heavily doped source/drain impurity distribution 118. FIG. 1 further includes a second transistor 105b electrically isolated from first transistor 105a by isolation structure 122. Isolation structure 122 is preferably a shallow trench isolation structure (as shown in FIG. 1) or a field oxide structure both of which are well known within the field of semiconductor processing.

Figure 2:
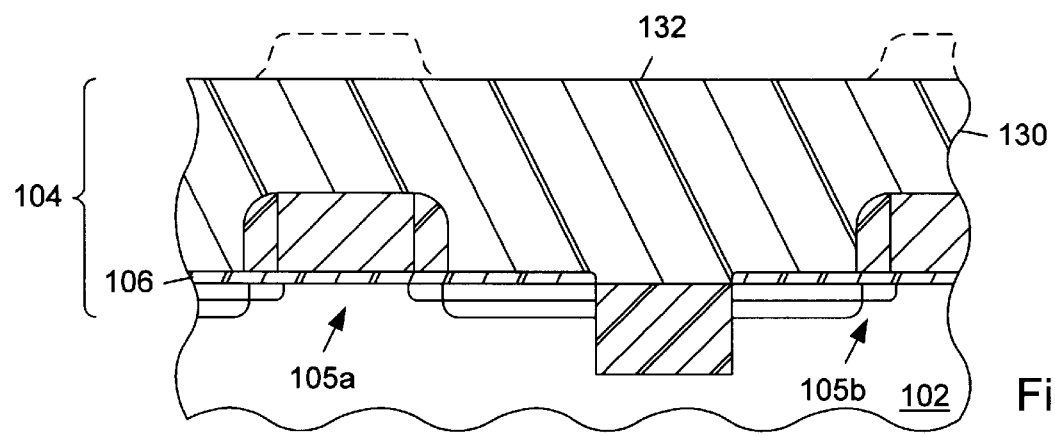
FIG. 2 is a processing step subsequent to FIG. 1 in which an interlevel dielectric layer has been formed on top of and incorporated the first transistor level.

Turning now to FIG. 2 interlevel dielectric layer 130 is deposited over semiconductor substrate 102 and first and second transistors 105a and 105b. After the deposition of interlevel dielectric layer 130 a planarization step is typically executed to produce a substantially planar upper surface 132 of interlevel dielectric 130. Portions of interlevel dielectric 130 removed during the planarization step are shown in phantom in FIG. 2. A typical planarization process includes a chemical mechanical polish possibly in combination with conventional photolithography and etch processes. The deposition of interlevel dielectric 130, in a presently preferred embodiment is accomplished with a low pressure (i.e., less than two torrs) chemical vapor deposition process using a TEOS or silane source. For purposes of this disclosure, first transistor level 104 includes interlevel dielectric layer 130.

Figure 3:
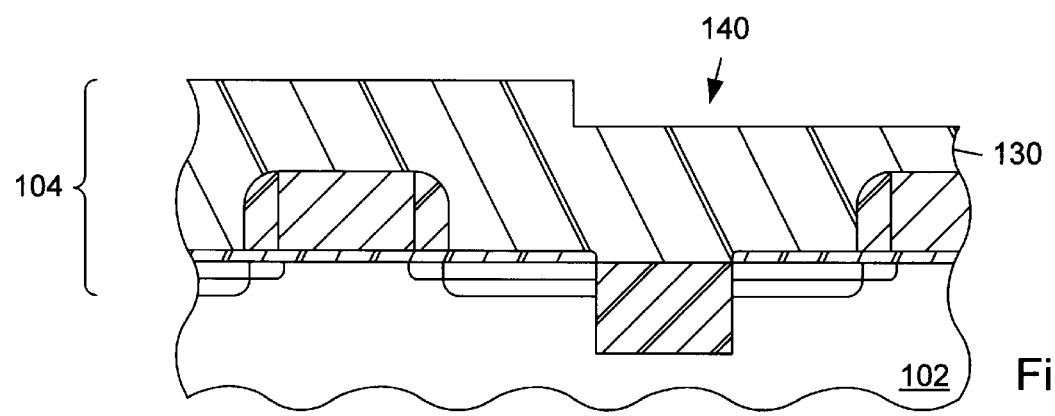
FIG. 3 is a processing step subsequent to FIG. 2 in which a local interconnect trench has been formed in the interlevel dielectric layer.

Turning to FIG. 3, a local interconnect trench 140 is etched into interlevel dielectric 130. Formation of local interconnect trench 140 is preferably accomplished by patterning a resist layer with a photolithography step and performing an anisotropic dry etch process with reactive ion etcher, using a reactant gas comprising $CF_4$, $CHF_3$, and $O_2$.

Figure 4:
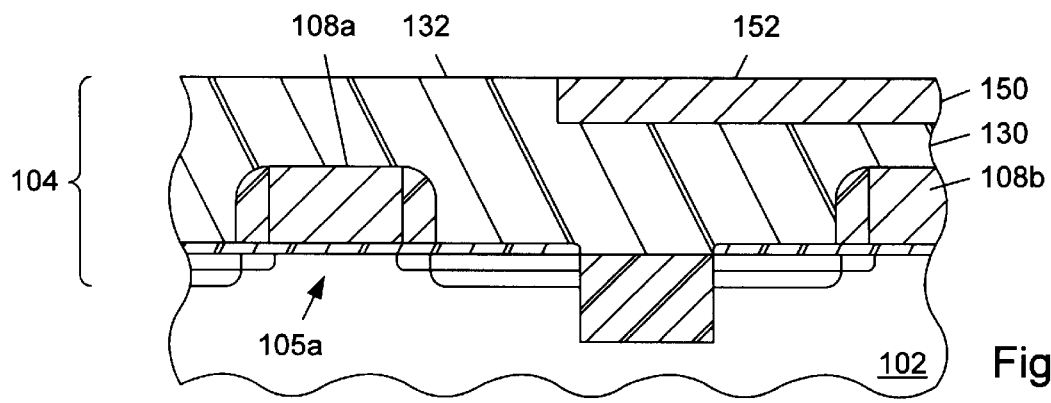
FIG. 4 is a processing step subsequent to FIG. 3 in which a local interconnect has been formed.

In FIG. 4, local interconnect 152 is formed by depositing a local interconnect material on the topography of interlevel dielectric layer 130 and, preferably, planarizing the local interconnect material to achieve an upper surface 152 of local interconnect 150 that is substantially planar with an upper surface 132 of interlevel dielectric 130 and to remove portions of the local interconnect material exterior to local interconnect trench 140. A presently preferred process for deposition of the local interconnect material includes the thermal decomposition of silane in a chamber maintained at a temperature in the range of approximately 500° to 680° C. to produce a CVD polysilicon film. Displaced above transistors 105a and 105b of first transistor level 104, local interconnect 150 is able to traverse gate structures 108a and 108b without making electrical contact to the gates.

Figure 5:
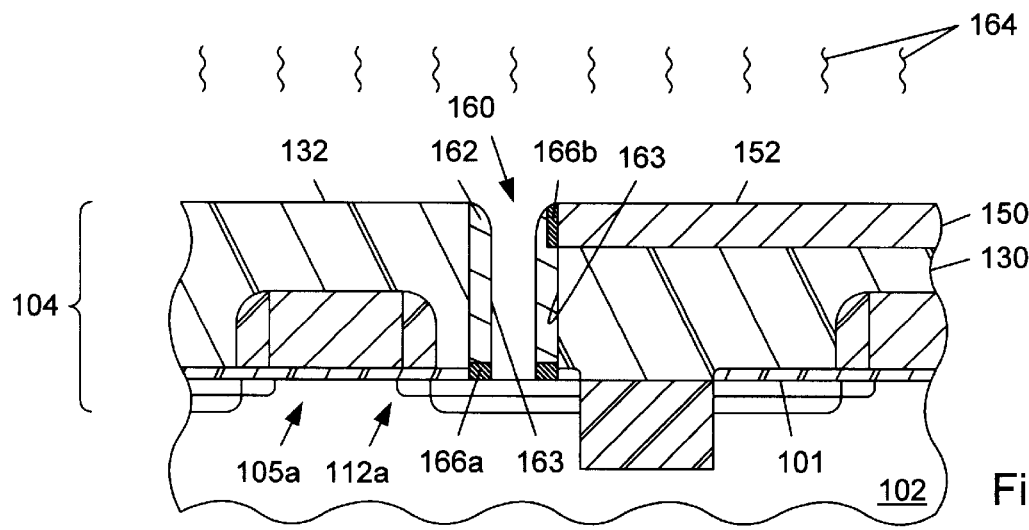
FIG. 5 is a processing step subsequent to FIG. 4 in which the contact tunnel has been etched into the interlevel dielectric layer, a metal spacer formed on a sidewall of the contact structure, and silicide regions formed at the spacer/silicon interfaces.

Turning now to FIG. 5, a contact tunnel 160 is etched into interlevel dielectric 130 over a first source/drain region 112a of first transistor 105a. Formation of contact tunnels such as contact tunnel 160 is preferably accomplished with an anisotropic dry etch process after a photoresist mask (not shown in the drawing) has been photolithographically patterned over the semiconductor substrate. Subsequent to the formation of contact tunnel 160 a metal spacer structure 162 is formed on sidewall 163 of contact tunnel 160. It will be appreciated by those skilled in the art that cross-sectional view of contact structure 160 shown in FIG. 5 is continuous around sidewall 163 of contact tunnel 160. Formation of spacer structure 162 is typically accomplished by depositing a conformal metal layer upon the topography defined by interlevel dielectric layer 130 and contact tunnel 160. Thereafter, an anisotropic dry etch process is performed with a minimal (i.e., less than approximately 10%) overetch. This well known deposition/etch sequence removes portions of the deposited layer from planar regions of the semiconductor topography while leaving portions of the deposited film on vertical portions of the topography. "Planar regions" of the topography refers to those regions of upper surface 132 an 152 that are substantially parallel to upper surface 101 of semiconductor substrate 102.

Ideally, the metal used for metal spacer 162 is capable of reacting with the silicon and first source/drain structure 112a and the silicon in the preferred embodiment of local interconnect 150 to produce a low resistivity contact to the silicon. It is known that certain metals react with silicon at elevated temperatures to produce a silicide useful in reducing the contact's resistivity. Preferably, the metal used for metal spacer 162 is platinum, palladium, cobalt, nickel, titanium or an appropriate alloy thereof. These metals are preferred because they are known to form silicides exhibiting extremely low resistivities (i.e., less than 50 $\mu\Omega$-cm). In addition, the preferred metals are known to react with silicon at temperatures less than approximately 600° C. Silicide formation at temperatures lower than 600° C. beneficially minimizes the redistribution of the source/drain structures. Because silicides are formed only at the interface of the metal and silicon, the silicides are inherently self aligned with the silicon structure. In other words, where there is no silicon present in the immediate vicinity of the metal, no silicide will form and thus, the silicide formation is aligned with the silicon structures without requiring an additional photolithography step. FIG. 5 shows an anneal 164 comprising an elevated temperature process during which time a first silicide 166b is formed at an interface between metal spacer structure 162 and local interconnect 150. A second silicide 166a is simultaneously formed at an interface between spacer structure 162 and first source/drain structure 112a. Anneal 164 is preferably carried out at a temperature not exceeding 600° C. and may be performed using a tube-type apparatus or, more preferably, a rapid thermal anneal apparatus. First silicide 166a and second silicide 166b provide a self aligned, low resistivity interface between metal spacer 162 and the appropriate silicon region. As seen in FIG. 5, spacer structure 162 therefore provides an electrical connection between local interconnect 150 and first source/drain structure 113a.

Figure 6:
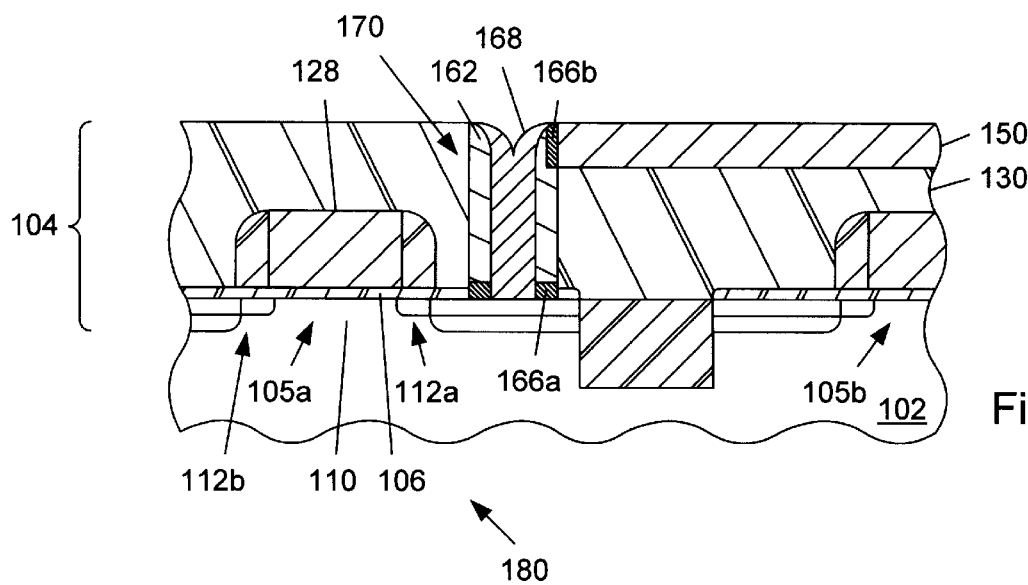
FIG. 6 is a processing step subsequent to FIG. 5 in which the contact tunnel core has been filled with a metal.

Turning to FIG. 6, a second metal 168 is typically introduced into the contact tunnel core defined by inner sidewall 163 of spacer structure 162. Preferred metals for second metal 168 include tungsten, aluminum, copper or alloys thereof In one embodiment, second metal 168 is deposited and etched in a manner similar to the formation of metal spacer structure 162. If the diameter of the contact tunnel core defined by inner sidewall 163 of metal spacer structure 162 is small enough, the core may be adequately filled by simply depositing second metal 168 and performing a spacer etch to remove portions of the second metal layer from regions exterior to contact tunnel 160. If the diameter of contact metal 160 is somewhat greater, however, a chemical mechanical polish or other planarization process may be required to adequately remove portions of the second metal layer from regions exterior to contact tunnel 160.

FIG. 6, therefore, depicts an integrated circuit 180. Integrated circuit 180 includes first transistor level 104 formed on an upper surface 101 of semiconductor substrate 102, local interconnect 150 and contact structure 170. First transistor level 104 includes first transistor 105. Local interconnect 150 is vertically displaced above first transistor 105a and second transistor 105b such that local interconnect 150 may traverse first transistor 105a and second transistor 105b without contacting the transistors. Contact structure 170 provides an electrical connection between first source/drain structure 112a of first transistor 105a and local interconnect 150. In one embodiment, first transistor level 104 further includes interlevel dielectric 130. First transistor 105a, in the preferred embodiment, includes gate dielectric 106, conductive gate 108 and a pair of source/drain structures 112a and 112b. Conductive gate 108 is aligned over a channel region 110 of semiconductor substrate 102. Source/drain structures 112a and 112b are laterally displaced within semiconductor substrate 102 on either side of channel region 110. Preferably gate dielectric 106 is a thermal oxide and conductive gate 108 is heavily doped polysilicon (for purposes of this disclosure, heavily doped polysilicon refers to polysilicon having a sheet resistivity of less than approximately 500 $\Omega$/square). In the preferred embodiment, the local interconnect comprises polysilicon. The preferred contact structure 170 includes a metal outer shell 162, a first silicide 166a, and a second silicide 166b. Metal outer shell 162 extends from first source/drain structure 112a to local interconnect 150. First silicide 166a is formed at an interface between outer shell 162 and first source/drain structure 112a. Second silicide 166b is formed at an interface between outer shell 162 and local interconnect 150. Metal outer shell 162 is preferably comprised of cobalt, nickel, titanium, platinum, or palladium. In one presently preferred embodiment, contact structure 170 further includes a core metal 168 filling the contact tunnel core defined by the inner sidewall 163 of metal outer shell 162. In the preferred embodiment, metal core 168 is formed of aluminum, tungsten, copper, or alloys thereof.

It will, therefore, be appreciated to those skilled in the art having the benefit of this disclosure that this invention is capable of producing an integrated circuit in which the local interconnect is connected to an underlying transistor level utilizing a silicide structure formed at an interface between a contact structure and the local substrate and at an interface between the contact structure and a source/drain structure of the underlying transistor level. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor fabrication process, comprising:
   providing a semiconductor substrate;
   forming a first transistor level on an upper surface of said semiconductor substrate, wherein said first transistor level includes a first transistor;
   forming a local interconnect, wherein said local interconnect is vertically displaced above said first transistor level such that said local interconnect may traverse a gate of said first transistor without contacting said gate;
   forming a contact structure connecting a first source/drain structure of said first transistor with said local interconnect, wherein said contact structure includes a first self-aligned silicide at an interface between said contact structure and said source/drain region and a second self-aligned silicide at an interface between said contact structure and said local interconnect.

2. The process of claim 1, wherein said semiconductor substrate comprises a p-type epitaxial layer formed on a p+ silicon bulk, and wherein a resistivity of said p-type epitaxial layer is in the range of approximately 10 to 15 $\Omega$-cm.

3. The process of claim 1, wherein the step of forming said first transistor level comprises:
   forming a gate dielectric on said upper surface of said semiconductor substrate;
   depositing a first conductive gate layer on said gate dielectric;
   patterning said first conductive gate layer to produce a first conductive gate structure, wherein said first conductive gate structure is aligned over a first channel region of said semiconductor substrate;
   forming a first pair of source/drain structures in said semiconductor substrate, wherein said first source/drain structures are laterally disposed on either side of said channel region of said semiconductor substrate.

4. The process of claim 1, wherein said first transistor level further includes an interlevel dielectric, wherein said interlevel dielectric electrically isolates said first transistor level.

5. The process of claim 4 wherein the step of forming said first transistor level further includes the steps of:
   depositing oxide on a topography cooperatively defined by said first transistor and an upper surface of said semiconductor substrate; and
   planarizing said interlevel dielectric to produce a substantially planar dielectric upper surface.

6. The process of claim 1 wherein the step of forming said local interconnect comprises:
   etching a local interconnect trench in said interlevel dielectric;
   depositing a local interconnect material over said interlevel dielectric; and
   removing portions of said local interconnect material from regions exterior to said local interconnect trench.

7. The process of claim 6 wherein said local interconnect material comprises polysilicon.

8. The process of claim 6 wherein the step of removing said portions comprises chemical mechanical polishing.

9. The process of claim 1 wherein the step of forming said contact structure comprises:
   etching a contact opening in said interlevel dielectric wherein said contact opening communicates from said local interconnect to said first source/drain structure;
   forming a metal spacer structure on a sidewall of said contact opening, wherein said metal spacer structure contacts said local interconnect and wherein said spacer structure contacts said first source/drain structure;
   depositing a core metal in contact with said metal spacer structure to fill a contact structure core defined by inner sidewall of said metal spacer structure; and
   annealing said contact structure wherein said silicide is formed in contact with said local interconnect and in contact with said first source/drain structure.

10. The process of claim 9 wherein said metal spacer structure comprises a metal selected from the group consisting of nickel, palladium, platinum, titanium, and cobalt.

* * * * *